(12) United States Patent
Elschner et al.

(10) Patent No.: US 8,252,889 B2
(45) Date of Patent: Aug. 28, 2012

(54) POLYTHIOPHENE FORMULATIONS FOR IMPROVING ORGANIC LIGHT EMITTING DIODES

(75) Inventors: Andreas Elschner, Mülheim (DE); Knud Reuter, Krefeld (DE); Peter Wilfried Loevenich, Köln (DE)

(73) Assignee: Heraeus Precious Metals GmbH & Co. KG (DE)

( * ) Notice: Subject to any disclaimer, the term of this patent is extended or adjusted under 35 U.S.C. 154(b) by 130 days.

(21) Appl. No.: 11/655,595

(22) Filed: Jan. 19, 2007

(65) Prior Publication Data

US 2007/0172702 A1    Jul. 26, 2007

(30) Foreign Application Priority Data

Jan. 20, 2006 (DE) .......................... 10 2006 002 798

(51) Int. Cl.
*C08G 75/00* (2006.01)
(52) U.S. Cl. ...................... 528/373; 528/380; 528/377
(58) Field of Classification Search .................. 528/373
See application file for complete search history.

(56) References Cited

U.S. PATENT DOCUMENTS

| | | | |
|---|---|---|---|
| 4,539,507 A | 9/1985 | VanSlyke et al. | |
| 5,150,006 A | 9/1992 | Van Slyke et al. | |
| 5,300,575 A | 4/1994 | Jonas et al. | |
| 5,370,981 A | 12/1994 | Krafft et al. | |
| 6,376,105 B1 | 4/2002 | Jonas et al. | |
| 6,391,481 B1 | 5/2002 | Jonas et al. | |
| 2002/0136923 A1 | 9/2002 | Jonas et al. | |
| 2004/0010115 A1* | 1/2004 | Sotzing | 528/377 |
| 2004/0074779 A1* | 4/2004 | Sotzing | 205/414 |
| 2004/0102577 A1* | 5/2004 | Hsu et al. | 525/182 |
| 2005/0013094 A1 | 1/2005 | Reuter et al. | |
| 2005/0175861 A1 | 8/2005 | Elschner et al. | |
| 2006/0076557 A1 | 4/2006 | Waller et al. | |

FOREIGN PATENT DOCUMENTS

| | | |
|---|---|---|
| CA | 2343444 | 3/2000 |
| CN | 1577657 | 2/2005 |
| CN | 1654506 | 8/2005 |
| DE | 19627071 | 1/1998 |
| DE | 19841804 | 3/2000 |
| EP | 0440957 | 8/1991 |
| EP | 0564911 | 10/1993 |
| EP | 0686662 | 12/1995 |
| EP | 0991303 | 4/2000 |
| EP | 1227529 | 7/2002 |
| EP | 1498920 | 1/2005 |
| EP | 1559739 | 8/2005 |
| EP | 1564251 | 8/2005 |
| EP | 1647566 | 4/2006 |
| WO | WO-90/13148 | 11/1990 |

OTHER PUBLICATIONS

Product catalog of Clevios P AI 4083 (former Baytron P AI 4083, H.C. Stark, Jan. 2009).*
Blanchard, et al., "Thieno[3,4-*b*]-1,4-oxathiane: An Unsymmetrical Sulfur Analogue of 3,4-Ethylenedioxythiophene (EDOT) as a Building Block for Linear π-Conjugated Systems," *Organic Letters*, (2002), vol. 4, No. 4, pp. 607-609.
DIN EN ISO 3915 (Oct. 1999).
Gogte, et al., "Synthesis of Potential Anticancer Agents-I. Synthesis of Substituted Thiophenes," *Tetrahedron*, (1967), vol. 23, pp. 2437-2441.
Handbook of Conducting Polymers (ed. Skotheim, T.A.), Marcel Dekker: New York, 1986, vol. 1, 46-57.
Houben Weyl, Methoden der organischen Chemie, vol. E 20 Makromolekulare Stoffe, part 2, (1987), p. 1141 et seq.
Lee, et al., "Water Dispersible Low Band Gap Conductive Polymer Based on Thieno[3,4-*b*]thiophene," *Synthetic Metals*, (2005), vol. 152, pp. 177-180.
Service, "Self-Assembled LEDs Shine Brightly," *Science*, (1998), vol. 279, p. 1135.
Sheats, et al., "Organic Electroluminescent Devices," *Science*, (Aug. 16, 1996), vol. 273, pp. 884-888.
Lee et al., "Conjugated Polymers from Thieno[3,4-b]thiophene Dimers", Polymer Preprints, vol. 46, No. 2, pp. 860-861, 2005.
Sotzing et al., "Poly(thieno[3,4-b]thiophene) as a Low Band Gap Conducting Polymer and Electrochromic Material", Polymeric Materials: Science & Engineering, vol. 85, pp. 604-605, 2001. Lee et al., "Suspension Polymerization of Thieno[3,4-B]thiophene in Water to Produce Low Band Gap Conjugated Polymers", Polymer Preprints, vol. 46, No. 2, pp. 1010-1011, 2005.
Kumar et al., "Poly(thieno[3,4-B]furan), a New Low Band Gap Conjugated Polymer", Polymer Preprints, vol. 46, No. 2, pp. 969-970, 2005.
Seshadri et al., "Electrochromic Windows Using a Low Band Gap Conjugated Polymer as the Ion Storage Layer", Polymer Preprints, vol. 46, No. 2, pp. 878-879, 2005.
Lee et al., "Ring-Sulfonated Poly(thienothiophen)", Advanced Materials, vol. 17, pp. 1792-1795, 2005.
Lee et al., "Poly(thieno[3,4-b]thiophene), A New Stable Low Band Gap Conducting Polymer", Macromolecules, vol. 34, pp. 5746-5747, 2001.

\* cited by examiner

*Primary Examiner* — Randy Gulakowski
*Assistant Examiner* — Shane Fang
(74) *Attorney, Agent, or Firm* — Connelly Bove Lodge & Hutz LLP

(57) ABSTRACT

The invention relates to formulations comprising polythiophenes A) comprising at least one polythiophene containing recurring units of the general formula (I-a) and/or (I-b)

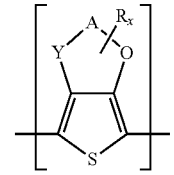

(I-a)

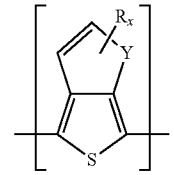

(I-b)

and at least two further polymers, the use thereof and electroluminescent arrangements comprising hole-injecting layers comprising these formulations.

12 Claims, No Drawings

POLYTHIOPHENE FORMULATIONS FOR IMPROVING ORGANIC LIGHT EMITTING DIODES

The invention relates to formulations comprising polythiophenes and further polymers, the use thereof and electroluminescent arrangements comprising hole-injecting layers comprising these formulations.

An electroluminescent arrangement (EL arrangement) is characterized in that it emits light with a flow of current when an electrical voltage is applied. Such arrangements have been known for a long time by the name "light emitting diodes" (LEDs). The emission of light arises by positive charges (holes) and negative charges (electrons) recombining and sending out light.

The LEDs customary in the art are all predominantly made of inorganic semiconductor materials. However, EL arrangements in which the essential constituents are organic materials have been known for some years.

These organic EL arrangements as a rule comprise one or more layers of organic charge transport compounds.

The main layer structure of an EL arrangement is e.g. as follows:
1 Carrier, substrate
2 Base electrode
3 Hole-injecting layer
4 Electron-blocking layer
5 Emitter layer
6 Hole-blocking layer
7 Electron-injecting layer
8 Top electrode
9 Contacts
10 Covering, encapsulation This structure represents the most detailed case and can be simplified by omitting individual layers, so that one layer takes over several tasks. In the simplest case, an EL arrangement comprises two electrodes, between which there is an organic layer which fulfils all the functions—including the emission of light.

However, it has been found in practice that to increase the luminous density, electron- and/or hole-injecting layers in the electroluminescent constructions are particularly advantageous.

It is known from EP-A-686 662 to employ specific mixtures of conductive organic polymers, such as poly(3,4-ethylenedioxythiophene), and, for example, polyhydroxy compounds or lactams as electrodes in electroluminescence displays. However, it has been found in practice that these electrodes have an inadequate conductivity, especially for large-area displays. On the other hand, the conductivity is adequate for small displays (luminous area <1 cm²).

It is known from DE-A-196 27 071 to employ polymeric organic conductors, e.g. poly(3,4-ethylenedioxythiophene), as hole-injecting layers. By this means, the luminous intensity of the electroluminescent displays can be increased significantly compared with constructions without the use of polymeric organic intermediate layers. By reducing the particle size of the poly(3,4-alkylenedioxythiophene) dispersions, the conductivity can be adjusted in a controlled manner. It is therefore possible to prevent electrical over-talking of adjacent address lines (crosstalk), in particular in passive matrix displays (EP-A-1 227 529).

EP-A 1 564 251 furthermore reports that the life of these displays can be improved by using specific polymeric anions.

Nevertheless, the conductivity of the hole-injecting layers of known materials is too high for some uses, such as, for example, passive matrix displays, in spite of the possibility of controlled adjustment via the particle size, or the production of the displays is no longer economical enough because of the increased outlay for the prior reduction of the particle sizes.

There therefore continued to be a need to produce EL arrangements which, in addition to a high luminous strength (luminous intensity) and a long life, have a lower conductivity of the hole-injecting layer than known EL arrangement. For example, in passive matrix displays this would have the advantageous effect of reduction of crosstalk, without having to use starting materials having particularly small particle sizes.

The object of the present invention was therefore to discover and provide suitable formulations for the production of such EL arrangements. A further object was to produce improved EL arrangements from these materials.

It has been found, surprisingly, that hitherto unknown formulations comprising specific optionally substituted polythiophenes and further polymers are outstandingly suitable for the production of hole-injecting layers for EL arrangements, and these hole-injecting layers can prevent the occurrence of crosstalk without the requirement of particularly small particle sizes.

The present invention therefore provides formulations comprising
A) at least one polythiophene containing recurring units of the general formula (I-a) and/or (I-b)

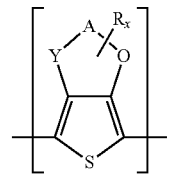
(I-a)

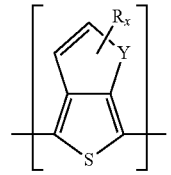
(I-b)

wherein
A represents an optionally substituted $C_1$-$C_5$-alkylene radical, preferably an optionally substituted ethylene or propylene radical, particularly preferably a 1,2-ethanediyl radical,
Y independently of one another, represents O or S,
R represents a linear or branched $C_1$-$C_{18}$-alkyl radical, preferably a linear or branched $C_1$-$C_{14}$-alkyl radical, particularly preferably a methyl or ethyl radical, a $C_5$-$C_{12}$-cycloalkyl radical, a $C_6$-$C_{14}$-aryl radical, a $C_7$-$C_{18}$-aralkyl radical, a $C_1$-$C_4$-hydroxyalkyl radical or a hydroxyl radical,
x represents an integer from 0 to 8, preferably 0, 1 or 2, particularly preferably 0 or 1 and
in the case where several radicals R are bonded to A, these can be identical or different,
wherein, in the case where in the general formula (I-a) Y represents O, the polythiophene furthermore contains recurring units of the general formula (I-a) wherein Y represents S, or recurring units of the general formula (I-b)

B) at least one polymer containing $SO_3^-M^+$ or $COO^-M^+$ groups, wherein $M^+$ represents $H^+$, $Li^+$, $Na^+$, $K^+$, $Rb^+$, $Cs^+$ or $NH_4^+$, preferably $H^+$, $Na^+$ or $K^+$, and C) at least one partly fluorinated or perfluorinated polymer containing $SO_3^-M^+$ or $COO^-M^+$ groups, wherein $M^+$ represents $H^+$, $Li^+$, $Na^+$, $K^+$, $Rb^+$, $Cs^+$ or $NH_4^+$, preferably $H^+$, $Na^+$ or $K^+$.

The general formula (I) is to be understood as meaning that the substituent R can be bonded x times to the alkylene radical A.

Formulation (composition) in the context of the invention is any mixture of components A), B) and C) as a solid, solution or dispersion. In addition to the polythiophene(s) A), other known conductive polymers can also be employed, in particular optionally substituted polyanilines, polypyrroles or polythiophenes, such as e.g. homopolythiophenes of recurring units of the general formula (I-a) wherein Y represents O. Such a preferred homopolythiophene of recurring units of the general formula (I-a) wherein Y represents O is poly(3,4-ethylenedioxythiophene). These various conductive polymers can be employed in any desired mixture with the polythiophenes A).

Substituted here and in the following, unless expressly mentioned otherwise, is to be understood as meaning substitution with a group chosen from the series:

alkyl, preferably $C_1$-$C_{20}$-alkyl, cycloalkyl, preferably $C_3$-$C_{20}$-cycloalkyl, aryl, preferably $C_6$-$C_{14}$-aryl, halogen, preferably Cl, Br, I, ether, thioether, disulfide, sulfoxide, sulfone, amino, aldehyde, keto, carboxylic acid ester, cyano, alkylsilane and alkoxysilane groups, as well as carboxamide groups.

In preferred embodiments of the formulation according to the invention, at least one polythiophene containing recurring units of the general formula (I-a) and/or (I-b) is one containing recurring units of the general formula (I-aa) and/or (I-bb)

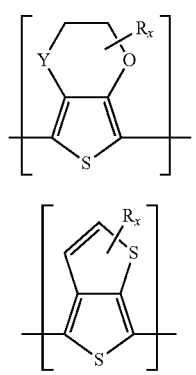

wherein

R, Y and x have the abovementioned meaning.

In very particularly preferred formulations according to the above description, x represents 0 or 1. In this case where x is 1, R particularly preferably represents methyl or hydroxymethyl.

In further preferred embodiments of the formulation according to the invention, at least one polythiophene A) containing recurring units of the general formula (I-a) and/or (I-b) is one containing recurring units of the general formula (I-aa-1) and/or (I-aa-2) and/or (I-bb-1)

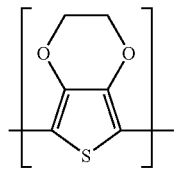

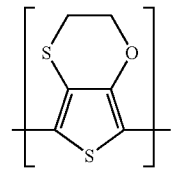

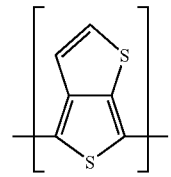

In the context of the invention, the prefix poly- is to be understood as meaning that the polymer or polythiophene contains more than one identical or different recurring unit. The polythiophenes contain in total n recurring units of the general formula (I-a) and/or (I-b), wherein n can be an integer from 2 to 2,000, preferably 2 to 100. The recurring units of the general formula (I-a) and/or (I-b) can in each case be identical or different within a polythiophene. Preferred polythiophenes are those containing in each case identical recurring units of the general formula (I-a) wherein Y represents S, polythiophenes containing in each case identical recurring units of the general formula (I-b) wherein Y represents S, and copolymers containing recurring units of the general formula (I-a) wherein Y represents both O and S, or copolymers containing recurring units of the general formulae (I-a) and (I-b). These are particularly preferably homopolythiophenes of recurring units of the general formula (I-aa) wherein Y represents S, or of recurring units of the general formula (I-bb), very particularly preferably those homopolythiophenes of recurring units of the formula (I-aa-2) or (I-bb-1). Polythiophenes which are furthermore particularly preferred are copolythiophenes of recurring units of the general formula (I-aa) wherein Y represents both O and S, or of recurring units of the general formulae (I-aa) and (I-bb), very particularly preferably those copolythiophenes of recurring units of the formulae (I-aa-1) and (I-aa-2), of recurring units of the formulae (I-aa-1) and (I-bb-1) or of recurring units of the formulae (I-aa-2) and (I-bb-1).

In the context of the invention, recurring units are to be understood as meaning units of the general formulae (I-a), (I-b), (I-aa), (I-bb), (I-aa-1), (I-aa-2) or (I-bb-1), summarized in the following as recurring units of the general formula (I), regardless of whether the polythiophene contains one or more of them. That is to say, units of the general formula (I) are also to be understood as recurring units if the polythiophene contains them only once.

Formulations according to the invention can also be those which, in addition to at least one of the polythiophenes A) described above containing recurring units of the general formula (I), comprise further conductive polymers, such as polyanilines, polypyrroles or other polythiophenes, in the mixture. In preferred embodiments, the formulations according to the invention can comprise, in addition to the polythiophenes A) described above containing recurring units of the general formula (I), poly(3,4-ethylenedioxythiophene) as another polythiophene in the mixture.

The polythiophenes preferably in each case carry H on the end groups.

The polythiophenes A) contain in total n recurring units of the general formula (I), wherein n is preferably an integer from 2 to 1,000, preferably 3 to 100, particularly preferably 4 to 15.

$C_1$-$C_5$-Alkylene radicals A are, in particular, methylene, ethylene, n-propylene, n-butylene or n-pentylene. $C_1$-$C_{18}$-Alkyl represents, in particular, linear or branched $C_1$-$C_{18}$-alkyl radicals, for example methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl represents $C_5$-$C_{12}$-cycloalkyl radicals, such as, for example, cyclopentyl, cyclohexyl, cycloheptyl, cyclooctyl, cyclononyl or cyclodecyl, $C_6$-$C_{14}$-aryl represents $C_6$-$C_{14}$-aryl radicals, for example phenyl or naphthyl, $C_7$-$C_{18}$-aralkyl represents $C_7$-$C_{18}$-aralkyl radicals, for example benzyl, and $C_7$-$C_{18}$-alkylaryl represents $C_7$-$C_{18}$-alkylaryl radicals, for example o-, m-, p-tolyl, 2,3-, 2,4-, 2,5-, 2,6-, 3,4-, 3,5-xylyl or mesityl. The above list serves to explain the invention by way of example and is not to be regarded as conclusive.

The preparation of the polythiophenes A) described above containing recurring units of the general formula (I) is described in principle in EP-A 440 957, in Blanchard, Philippe; Cappon, Alexandre; Levillain, Eric; Nicolas, Yohann; Frere, Pierre; Roncali, Jean, Organic Letters (2002), 4(4), 607-609, and in Lee, Byoungchul; Seshadri, Venkataramanan; Sotzing, Gregory A., Synthetic Metals (2005), 152(1-3), 177-180.

The polymerization of the corresponding monomeric starting compounds is carried out with suitable oxidizing agents in suitable solvents. Examples of suitable oxidizing agents are iron (III) salts, in particular $FeCl_3$ and iron (III) salts of aromatic and aliphatic sulfonic acids, $H_2O_2$, $K_2Cr_2O_7$, $K_2S_2O_8$, $Na_2S_2O_8$, $KMnO_4$, alkali metal perborates and alkali metal or ammonium persulfates or mixtures of these oxidizing agents. Further suitable oxidizing agents are described, for example, in Handbook of Conducting Polymers (ed. Skotheim, T. A.), Marcel Dekker: New York, 1986, vol. 1, 46-57. Particularly preferred oxidizing agents are $FeCl_3$, $Na_2S_2O_8$ and $K_2S_2O_8$ or mixtures thereof. The polymerization is preferably carried out at a reaction temperature of from −20 to 100° C. Reaction temperatures of from 20 to 100° C. are particularly preferred. If appropriate, the reaction solution is then treated with at least one ion exchanger.

Suitable solvents for the abovementioned reaction are e.g. polar solvents, for example water, alcohols, such as methanol, ethanol, 2-propanol, n-propanol, n-butanol, diacetone alcohol, ethylene glycol, glycerol or mixtures of these. Aliphatic ketones, such as acetone and methyl ethyl ketone, aliphatic nitriles, such as acetonitrile, aliphatic and cyclic amides, such as N,N-dimethylacetamide, N,N-dimethylformamide (DMF) and 1-methyl-2-pyrrolidone (NMP), ethers, such as tetrahydrofuran (THF), and sulfoxides, such as dimethylsulfoxide (DMSO), or mixtures of these with one another or with the abovementioned solvents are also suitable.

The corresponding monomeric compounds for the preparation of polythiophenes A) containing recurring units of the general formula (I) are known. Their preparation is possible, for example, by reaction of the alkali metal salts of 3,4-dihydroxythiophene-2,5-dicarboxylic acid esters with the corresponding alkylene dihalides and subsequent decarboxylation of the free 3,4-(alkylenedioxy)thiophene-2,5-dicarboxylic acids (see e.g. Tetrahedron 1967, 23, 2437 - 2441 and J. Am. Chem. Soc. 1945, 67, 2217 - 2218), by transetherification of 3,4-dialkoxythiophenes with 2-mercapto-ethanol (Blanchard, Philippe; Cappon, Alexandre; Levillain, Eric; Nicolas, Yohann; Frere, Pierre; Roncali, Jean, Organic Letters (2002), 4(4), 607-609) or in the case of thieno(3,4-b) thiophene, in accordance with L. Brandsma, H. D. Verkrujisse, Synth. Commun. 20 (1990) 2275.

The resulting polythiophenes are very readily soluble or dispersible in the polar solvents or solvent mixtures.

The formulations according to the invention comprise, in addition to at least one partly fluorinated or perfluorinated polymer C), at least one further polymer B) containing $SO_3^-M^+$ or $COO^-M^+$ groups. Suitable polymers B) containing $SO_3^-M^+$ or $COO^-m^+$ groups are preferably those which contain no completely conjugated main chain, also abbreviated to non-conjugated in the following. Examples which may be mentioned of suitable polymers B) containing $SO_3^-M^-$ or $COO^-M^+$ groups are polymeric carboxylic acids, such as polyacrylic acids, polymethacrylic acid or polymaleic acids, or polymeric sulfonic acids, such as polystyrenesulfonic acids and polyvinylsulfonic acids. Copolymers of vinylcarboxylic and vinylsulfonic acids with other polymerizable monomers, such as acrylic acid esters and styrene, are furthermore also possible. Polystyrenesulfonic acid, poly-(styrenesulfonic acid-co-maleic acid) or poly-(vinylsulfonic acid) are particularly suitable. Very particularly suitable formulations are characterized in that they comprise polystyrenesulfonic acid (PSS) as at least one polymer B) containing $SO_3^-M^+$ or $COO^-M^+$ groups.

These polymers B) are preferably soluble or dispersible in polar solvents, such as water, alcohols, such as methanol, ethanol, 2-propanol, n-propanol, n-butanol, diacetone alcohol, ethylene glycol, glycerol, aliphatic ketones, such as acetone and methyl ethyl ketone, aliphatic nitriles, such as acetonitrile, aliphatic and cyclic amides, such as N,N-dimethylacetamide, N,N-dimethylformamide (DMF) and 1-methyl-2-pyrrolidone (NMP), ethers, such as tetrahydrofuran (THF), and sulfoxides, such as dimethylsulfoxide (DMSO), or mixtures containing these, preferably in water, alcohols, such as methanol, ethanol, 2-propanol, n-propanol and n-butanol, or mixtures of these.

Particularly suitable formulations according to the above description are characterized in that they comprise as at least one partly fluorinated or perfluorinated polymer C) containing $SO_3^-M^+$ or $COO^-M^+$ groups, for example, those containing recurring units of the formulae (II-a) and (II-b)

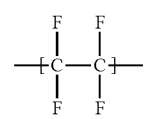
(II-a)

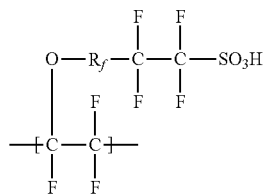
(II-b)

wherein R_f represents a radical having at least one, preferably 1 to 30 recurring unit(s) of the formula (II-c)

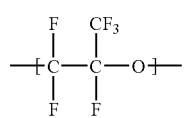

(II-c)

Such perfluorinated polymers are, for example, the polymers which are commercially obtainable under the trade name Nafion® or in dissolved form under the trade name Liquion®.

In particularly preferred embodiments, the novel formulation comprises Nafion® (copolymer of tetrafluoroethylene and the trifluorovinyl ether of poly(hexafluoropropylene oxide) mono(tetrafluorovinylsulfonic acid) ether) as at least one polymer C) containing $SO_3^-M^+$ or $COO^-M^+$ groups.

Formulations which comprise polystyrenesulfonic acid (PSS) as the polymer B) containing $SO_3^-M^+$ or $COO^-M^+$ groups and Nafion® (copolymer of tetrafluoroethylene and the trifluorovinyl ether of poly(hexafluoropropylene oxide) mono(tetrafluorovinylsulfonic acid) ether) as the partly fluorinated or perfluorinated polymer C) containing $SO_3^-M^+$ or $COO^-M^+$ groups are particularly preferred.

The molecular weight of the poly-acids is preferably 1,000 to 2,000,000, particularly preferably 2,000 to 500,000. The poly-acids or their alkali metal salts are commercially obtainable, e.g. polystyrenesulfonic acids and polyacrylic acids, or can be prepared by known processes (see e.g. Houben Weyl, Methoden der organischen Chemie, vol. E 20 Makromolekulare Stoffe, part 2, (1987), p. 1141 et seq.).

Formulations in which the weight ratio of polythiophene(s) A), where appropriate plus additional conductive polymer contained therein, to polymer(s) B) containing $SO_3^-M^+$ or $COO^-M^+$ groups is from 1 to 2 (1:2) to 1 to 25 (1:25), preferably from 1 to 2(1:2) to 1 to 20 (1:20) are very particularly preferred.

Formulations in which the weight ratio of polythiophene(s) A), where appropriate plus additional conductive polymer contained therein, to partly fluorinated or perfluorinated polymer(s) C) containing $SO_3^-M^+$ or $COO^-M^+$ groups is from 1 to 1 (1:1) to 1 to 50 (1:50), preferably from 1 to 2 (1:2) to 1 to 30 (1:30) are further very particularly preferred.

All desired combination of the two weight ratios described above for polythiophene(s) A) to polymer(s) B) containing $SO_3^-M^+$ or $COO^-M^+$ groups and polythiophene(s) A) to partly fluorinated or perfluorinated polymer(s) C) containing $SO_3^-M^+$ or $COO^-M^+$ groups can be realized in the preferred formulations and are regarded as disclosed herewith.

The novel formulations can furthermore additionally comprise at least one polar diluent D) (polar solvent). In the context of the invention, polar diluents D) (polar solvents) are to be understood as meaning diluents having a solubility parameter δ of 16 MPa$^{1/2}$ and above, preferably 19 MPa$^{1/2}$ and above. Solubility parameters are as a rule measured at the standard temperature (20° C.). For measurement and calculation of solubility parameters, see J. Brandrup et al., Polymer Handbook, 4th ed., 1999, VII/675 - VII/688. Solubility parameters are given in tabular form e.g. in J. Brandrup et al., Polymer Handbook, 4th ed., 1999, VII/688-VII/697. Preferred polar diluents D) are water, alcohols, such as methanol, ethanol, 2-propanol, n-propanol, n-butanol, diacetone alcohol, ethylene glycol, glycerol, aliphatic ketones, such as acetone and methyl ethyl ketone, aliphatic nitriles, such as acetonitrile, aliphatic and cyclic amides, such as N,N-dimethylacetamide, N,N-dimethylformamide (DMF) and 1-methyl-2-pyrrolidone (NMP), ethers, such as tetrahydrofuran (THF), and sulfoxides, such as dimethylsulfoxide (DMSO), or mixtures containing these. Particularly preferred polar diluents D) are water, alcohols or mixtures containing these, and water, methanol, ethanol, n-propanol, 2-propanol or n-butanol or mixtures containing these are very particularly preferred. In preferred embodiments, the novel formulations comprise mixtures of water and at least one alcohol as the polar diluent D).

Such novel preferred formulations comprising at least one polar diluent D) preferably comprise 99.99 to 80 wt. %, particularly preferably 99.8 to 95 wt. % of polar diluent(s) and have a solids content of from 0.01 to 20 wt. %, particularly preferably 0.2 to 5 wt. %, i.e. comprise in total 0.01 to 20 wt. %, particularly preferably 0.2 to 5 wt. % of polythiophene(s) A), polymer(s) B) and C) containing $SO_3^-M^+$ or $COO^-M^+$ groups and optionally further components contained therein, such as e.g. binders, crosslinking agents and/or surfactants, in dissolved and/or dispersed form.

The viscosity at 20° C. of novel preferred formulations comprising at least one polar diluent is between the viscosity of the diluent and 200 mPas, preferably <100 mPas.

To establish the desired solids content and the required viscosity, the desired amount of diluent can be removed from the formulations by distillation, preferably in vacuo, or by other processes, e.g. ultrafiltration.

Organic, polymeric binders and/or organic, low molecular weight crosslinking agents or surfactants can moreover be added to the formulations according to the invention. Corresponding binders are described e.g. in EP-A 564 911. Examples which may be mentioned here are polyvinylcarbazole as a binder, silanes, such as Silquest® A187 (OSi specialities), or surfactants as a crosslinking agent, such as the fluorosurfactant FT 248 (Bayer AG).

The formulations can preferably contain small amounts of ionic impurities in the limits such as are described in EP-A 991 303. The formulations preferably contain less than 1,000 ppm of ionic impurities.

The formulations according to the invention can be prepared in a simple manner by mixing an already finished mixture comprising at least one polymer B) containing $SO_3^-M^+$ or $COO^-M^+$ groups and at least one polythiophene A) in a weight ratio stated above for the formulations according to the invention, which is optionally in the form of a solution or dispersion, with at least one partly fluorinated or perfluorinated polymer C) containing $SO_3^-M^+$ or $COO^-M^+$ groups in a weight ratio to the polythiophene A) stated above for the formulations according to the invention, which is optionally in the form of a solution or dispersion. The present invention likewise provides this process for the preparation of the formulations according to the invention. For example, it is possible to mix an already finished mixture comprising at least one polymer B) containing $SO_3^-M^+$ or $COO^-M^+$ groups and at least one polythiophene A) with at least one partly fluorinated or perfluorinated polymer C) containing $SO_3^-M^+$ or $COO^-M_+$ groups and optionally to add at least one diluent to this mixture, preferably to completely or partly dissolve or disperse this mixture in at least one diluent. It is also possible to add to an already finished mixture comprising a polymer B) containing $SO_3^-M^+$ or $COO^-M^+$ groups and at least one polythiophene A) at least one diluent D) beforehand, preferably to completely or partly dissolve or disperse this finished mixture in at least one diluent D), to dissolve or disperse at least one partly fluorinated or perfluorinated polymer C) containing $SO_3^-M^+$ or $COO^-M^+$ groups in a diluent and then to mix the solution(s) and/or dispersion(s). If appropriate, all or some of the diluent D) or diluent mixture can then be removed again from this mixture, e.g. by distillation or other processes.

Surprisingly, the formulations according to the invention are outstandingly suitable for the production of hole-injecting or hole-transporting layers in EL arrangements, organic solar cells, organic laser diodes, organic thin film transistors or organic field effect transistors, for the production of electrodes or electrically conductive coatings.

The present invention therefore also provides the use of the formulations according to the invention for the production of hole-injecting layers in EL arrangements, for the production of electrodes or electrically conductive coatings.

These EL arrangement are used as display elements (displays), e.g. in flat screens, such as laptops, pagers, mobile telephones, navigation equipment, car radios, motor vehicle instrument panels, or as planar emitters, e.g. lamps, luminous areas, background illumination for LCD displays, signs.

In particular, EL arrangements having a hole-injecting layer comprising a formulation according to the invention are distinguished by a high luminous strength (luminous intensity) and long life, but have the advantage over known EL arrangements that an expensive control of the particle size to avoid, for example, crosstalk in passive matrix displays is not necessary.

Crosstalk is understood by the person skilled in the art as meaning the electrical over-talking between adjacent address lines in passive matrix displays. To avoid crosstalk in OLEDs it is necessary that none of the layers used has a specific electrical resistance of less than 1E4 Ohm·cm. For the hole-injecting layer in particular, there is the requirement that the resistivity is kept in the range of from $1·10^4$ Ohm·cm to $1·10^7$ Ohm·cm. The upper limit results from the need to limit the drop in voltage over the layer to a minimum. The resistivity is calculated from the product of the surface resistance and the layer thickness of the conductive polymer layer. The surface resistance for conductive polymers is measured in accordance with DIN EN ISO 3915 and the thickness of the polymer layer is measured with the aid of a stylus profilometer.

The formulation according to the invention offers a further advantage in respect of the electrical rectification ratio achieved in EL arrangements. This is understood by the person skilled in the art as meaning the ratio of the current in the forward direction to that in the reverse direction at a fixed voltage. If an OLED is polarized in the forward direction, i.e. the anode, e.g. ITO anode, connection is made to the positive pole of the voltage source and the vapour-deposited metal electrode is connected to the negative pole, and a forward current "I+" thus flows. If the polarity is reversed, a reverse current "I−" flows. Since during operation of passive matrix OLEDs the majority of individual luminous points (pixels) are polarized in the reverse direction, the highest possible rectification ratio is desirable, in order to keep the electrical losses low. Rectification ratios of I+/I−>$1·10^5$ are recommended.

The present invention therefore also provides EL arrangements, in particular light emitting diodes, comprising a hole-injecting layer comprising a formulation according to the invention. These are preferably those EL arrangements comprising at least two electrodes, of which optionally at least one is applied to an optionally transparent substrate, at least one emitter layer between the two electrodes and at least one hole-injecting layer between one of the two electrodes and the emitter layer, characterized in that the hole-injecting layer comprises a formulation according to the invention.

In the production of many EL arrangements of large area, e.g. electroluminescent display elements of large area, it is advantageous if at least one of the current-carrying electrodes is made of a transparent and conductive material. Examples of suitable such transparent and conductive electrode materials are a) metal oxides, e.g. indium tin oxide (ITO), tin oxide (NESA), doped tin oxide, doped zinc oxide etc.,
b) semi-transparent metal films, e.g. Au, Pt, Ag, Cu etc.,
c) semi-transparent conductive polymers, e.g. polythiophenes, polyanilines, polypyrroles etc.

An electrode which is not made of one of the abovementioned transparent and conductive materials is preferably a metal electrode, in particular a metal cathode.

Suitable materials for metal cathodes are the materials which are customary for electrooptical structures and are known to the person skilled in the art. Possible metal cathodes are, preferably, those of metals of low work of emission, such as Mg, Ca or Ba, or metal salts, such as LiF.

Suitable optionally transparent substrates are, for example, glass, extra-thin glass (flexible glass) or plastics, preferably films of plastic.

Particularly suitable plastics for the substrate are: polycarbonates, polyesters, such as e.g. PET and PEN (polyethylene terephthalate or polyethylene-naphthalene dicarboxylate), copolycarbonates, polyacrylate, polysulfone, polyether sulfone (PES), polyimide, polyethylene, polypropylene or cyclic polyolefins or cyclic olefin copolymers (COC), hydrogenated styrene polymers or hydrogenated styrene copolymers.

Suitable polymer substrates can be, for example, films, such as polyester films, PES films from Sumitomo or polycarbonate films from Bayer AG (Makrofol®).

The emitter layer of the EL arrangement according to the invention comprises at least one emitter material. Suitable emitter materials are those which are customary for electrooptical structures and are known to the person skilled in the art. Preferred possible emitter materials are conjugated polymers, such as polyphenylene-vinylenes and/or polyfluorenes, such as the polyparaphenylene-vinylene derivatives and polyfluorene derivatives described, for example, in WO-A 90/13148, or emitters from the class of low molecular weight emitters, also called small molecules in technical circles, such as aluminium complexes, e.g. tris(8-hydroxyquinolinato)aluminium ($Alq_3$), fluorescent dyestuffs, e.g. quinacridones, or phosphorescent emitters, e.g. $Ir(ppy)_3$. Emitter materials are described e.g. in DE-A 196 27 071.

In addition to the abovementioned layers, further functional layers can be contained in such an electroluminescent layer structure (EL arrangement), such as e.g. further charge-injecting, e.g. electron-injecting, charge-transporting or charge-blocking intermediate layers. Such layer structures are known to the person skilled in the art and are described, for example, in J. R. Sheats et al., Science 273, (1996), 884. One layer can also take over several tasks. For example, the abovementioned emitter materials can be employed in combination with a hole-transporting intermediate layer between the hole-injecting and emitter layer (cf. e.g. U.S. Pat. Nos. 4,539,507 and 5,150,006).

The production in principle of such EL arrangements is known to the person skilled in the art. For example, they can be produced by applying an electrode to a substrate from solution or dispersion or by vapour deposition. For example, metal oxide or semi-transparent metal film electrodes are preferably applied to the substrate by vapour deposition, while semi-transparent, conductive polymer electrodes are preferably applied from solution or dispersion. If appropriate, an adhesion promoter can be applied—by vapour deposition or from solution or dispersion—before application of the electrode material to the substrate. Some such substrates coated with electrode material are also already commercially obtainable (e.g. K glass, ITO-coated glass substrates). The hole-injecting layer can then be applied to the electrode, which in the case of the EL arrangements according to the invention with a hole-injecting layer comprising a formulation according to the invention advantageously takes place from solution or dispersion. The further layers are then applied to the hole-injecting layer in the sequence given in the introduction—taking into account that individual layers can be omitted—from solution or dispersion or by vapour deposition, depending on the material employed. The layer arrangement is then contacted and encapsulated.

The production of the hole-injecting layer comprising a formulation according to the invention is carried out by known technologies. For this, a formulation according to the invention—optionally in a solvent—is applied as a film to an electrode, preferably the base electrode. Suitable solvents are the abovementioned polar diluents, preferably water, alcohols or mixtures of these. Suitable alcohols are e.g. methanol, ethanol, n-propanol, 2-propanol and n-butanol.

The use of these solvents has the advantage that further layers can be applied from organic solvents, such as aromatic or aliphatic hydrocarbon mixtures, without the hole-injecting layer being attacked or redissolved.

The formulation according to the invention—optionally in a solvent—can be distributed uniformly on the electrode, for example, by printing techniques such as spin-coating, casting, knife-coating, printing, curtain casting etc. The layers can then be dried at room temperature or temperatures up to 300° C., preferably 100 to 200° C.

The formulation according to the invention—optionally in a solvent—can moreover preferably be applied in structured form by techniques such as ink-jet. This technique is known to the person skilled in the art and, with the use of water-soluble and dispersed polythiophenes, such as 3,4-polyethylenedioxy-thiophene:polystyrenesulfonic acid (PEDT:PSS), is described e.g. in Science, vol. 279, 1135, 1998 and DE-A 198 41 804.

The formulations according to the invention—optionally in a solvent—are preferably filtered through a filter before the application.

Formulations which can be filtered for purification particularly easily are obtained, for example, if, based on one part by weight of polythiophene(s) containing recurring units of the general formula (I), preferably 1 to 30 parts by weight, particularly preferably 2 to 25 parts by weight of the polymer(s) B) containing $SO_3^-M^+$ or $COO^-M^+$ groups are used in solvent D).

The thickness of the hole-injecting layer is, for example, 3 to 500 nm, preferably 10 to 200 nm.

EXAMPLES

Example 1

Preparation of the Poly(ethylenoxythiathiophene)-PSS Complex and its Mixture with Nafion®

A solution of 1.06 g PSS (molecular weight $M_w$=48,000) 0.47 g EOTT and 0.25 g sodium iodate in 103.7 g water was stirred at 50° C. for 7 d. Thereafter, the deep blue reaction mixture was deionized with in each case 9 g cation and anion exchanger (Lewatit® S 100 and Lewatit® MP 62) for 8 h and the ion exchanger resin was then filtered off. Ion contents: 1 ppm sulfate, 14 ppm $Na^+$, <20 ppm iodide.

The deionized formulation formed was mixed as follows for the preparation of the mixture according to the invention:

19.6 g of the above deionized formulation corresponding to 0.225 g PEOTT-PSS complex
12.97 g water
12.1 g ethanol
10.75 g Liquion® 1100 (Nafion®-containing solution from Ion Power Inc., US; 5 wt. % strength solution in 2-propanol/$H_2O$, 1,100 eq.), corresponding to 0.5 g Nafion®.

For this, ethanol and water were first metered into the Liquion® 1100, the mixture was stirred at 23° C. for ¼ h and the PEOTT-PSS complex was then metered in, after which the mixture was stirred at 23° C. for a further ½ h.

The weight ratio of monomer:PSS:fluorinated polymer corresponds to 1:2.3:7.3.

Example 2

Preparation of a Mixture of Poly(3,4ethylenedioxythiophene)/poly-styrenesulfonic and a Perfluorinated Polymer Polyethylenedioxythiophene/polystyrenesulfonic acid solution (H. C. Starck GmbH, Baytron® PH desalinated) was mixed with Nafion® solution (Liquion® 1100, 5 wt. % strength solution in 2-propanol/$H_2O$, 1,100 eq., Ion Power Inc., US) in a weight ratio of PEDT:PSS:Nafion® of 1:2.5:7.5.

Example 3

The formulation according to the invention from Example 1 was used to build up an organic light emitting diode (OLED). The procedure for production of the OLED was as follows:

1. Preparation of the ITO-coated Substrate

ITO-coated glass (Merck Balzers AG, FL, part no. 253 674 XO) was cut into pieces 50 mm×50 mm in size (substrates). The substrates were then cleaned in 3% strength aqueous Mucasol solution in an ultrasonic bath for 15 min. Thereafter, the substrates were rinsed with distilled water and spun dry in a centrifuge. This rinsing and drying operation was repeated 10 times. Directly before the coating, the ITO-coated sides were cleaned for 10 min in a UV/ozone reactor (PR-100, UVP Inc., Cambridge, GB).

2. Application of the Hole-injecting Layer

About 10 ml of the formulation according to the invention from Example 1 were filtered (Millipore HV, 0.45 μm). The cleaned ITO-coated substrate was placed on a lacquer spin-coater and the filtered solution was distributed over the ITO-coated side of the substrate. The supernatant solution was then spun off by rotating the plate at 500 rpm over a period of 30 s with the lid closed. Thereafter, the substrate coated in this way was dried on a hot-plate at 200° C. for 5 min. The layer thickness was 50 nm (Tencor, Alphastep 500).

The conductivity was determined on separate layers by vapour-depositing Ag electrodes 2.5 cm long at a distance of 0.5 mm via a strip mask (analogously to process step 4). The surface resistance determined with an electrometer was multiplied by the layer thickness in order to obtain the resistivity.

3. Application of the Emitter Layer 5 ml of a 1 wt. % strength xylene solution of the emitter Green 1300 LUMATION™ (Dow Chemical Company) were filtered (Millipore HV, 0.45 μm) and distributed over the dried hole-injecting layer. The supernatant solution of the emitter was then spun off by rotating the plate at 500 rpm for 30 s with the lid closed. Thereafter, the layer was dried on a hot-plate at 110° C. for 5 min. The total layer thickness was 130 nm.

All the further process steps were carried out in a pure $N_2$ atmosphere (inert gas glove box system, M. Braun, Garching)

into which the coated substrate was transferred. The coated substrate was first dried here on a hot-plate at 130° C. for 15 min.

4. Application of the Metal Cathode

A metal electrode was vapour-deposited as the cathode on to the emitter layer. For this, the substrate was placed with the emitter layer downwards on a strip mask which had holes of 2.5 mm diameter. A Ba layer 5 nm thick and then an Ag layer 200 nm thick were vapour-deposited in succession from two vapour deposition boats under a pressure of $p=10^{-3}$ Pa. The vapour deposition rates are 10 Å/s for Ba and 20 Å/s for Ag. The metal electrodes isolated had an area of 4.9 mm².

5. Characterization of the OLED

The two electrodes of the organic LED were connected (contacted) to a voltage source via electrical leads. The positive pole was connected to the ITO electrode and the negative pole was connected to the metal electrode via a thin flexible Au wire. The dependence of the OLED current and the electroluminescence intensity (detection was with a photodiode (EG&G C30809E)) on the voltage was recorded. The life was then determined by allowing a constant current of I=0.32 mA (8 mA/cm²) to flow through the arrangement and monitoring the voltage and light intensity as a function of time.

Comparison Example 3.1

Production of an OLED with a Mixture of Poly(3,4-ethylenedioxythiophene)/poly-styrenesulfonic Acid and Nafion® as the hole-injecting layer:

The procedure was as in Example 3, with the following deviation in process step 2.:

2. Application of the hole injection layer

About 10 ml of the solution from Example 2 were filtered (Millipore RV, 0.45 μm). The ITO-coated substrate was then placed on a lacquer spin-coater and the filtered solution was distributed over the ITO-coated side of the substrate. The supernatant solution was then spun off by rotating the plate at 850 rpm over a period of 30 s with the lid closed. Thereafter, the substrate coated in this way was dried for 5 min at 200° C. on a hot-plate. The layer thickness was 50 nm.

The metal cathodes were applied in accordance with process step 4 together with the layer structures from Example 3 in order to ensure comparability. Characterisation was likewise as in Example 3.

TABLE 1

Results of the measurements of the characteristic lines of the arrangements from Example 3 and Comparison Example 3.1

| | Spec, resistivity [Ohm · cm] | Efficiency at U = 4 V [cd/A] | Rectification ratio I+/I− at U = 8 V |
|---|---|---|---|
| OLED from Example 3 | >1 · 10⁶ | 6.7 | 2.2 · 10⁶ |
| OLED from Comparison Example 3.1 | 15 | 5.7 | 1.5 · 10³ |

The OLED according to the invention with the hole-injecting layer comprising the formulation according to the invention from Example 1 had a sufficiently high resistivity for use in passive matrix OLEDs. In contrast, the resistivity of the comparison example was too low and electrical over-talking (crosstalk) between adjacent address lines would be the consequence.

Further advantages of the OLED according to the invention from Example 3 are its higher efficiency and the significantly more favourable rectification ratio compared with the OLED according to the comparison example.

Example 4

Preparation of a Poly(thieno[3,4b]thiophene)/polystyrenesulfonic Acid Complex and its Mixture with Nafion®

A solution of 1.25 g PSS (molecular weight $M_w$=460,000 g/mol), 195.6 g water and 1.44 g 1% strength iron (III) sulfate solution in water was stirred at RT. 285 mg thieno[3,4-b] thiophene were added and the solution was stirred for 1 h. 726 mg sodium peroxodisulfate were added. After stirring for 3 h, 215 mg thieno[3,4-b]thiophene were added, and after a further 15 min, 474 mg sodium peroxodisulfate were added. After stirring for 18 h, the mixture was deionized with 10 g cation exchanger and 6 g anion exchanger (Lewatit® S 100 and Lewatit® MP 62) for 8 h and the ion exchanger resin was then filtered off. The dispersion of the poly(thieno[3,4-b] thiophene)/polystyrenesulfonic acid (PTT/PSS) was concentrated to half the volume on a rotary evaporator.

The formulation formed was mixed as follows for the preparation of the mixture according to the invention:
20 g of the above deionized formulation corresponding to 0.3 g PTT-PSS complex
13 g water
12.1 g ethanol
13.82 g Liquion® 1100 (Nafion®-containing solution from Ion Power Inc., US; 5 wt. % strength solution in 2-propanol/H₂O, 1,100 eq.), corresponding to 0.64 g Nafion®.

For this, ethanol and water were first metered into the Liquion® 1100, the mixture was stirred at 23° C. for ¼ h and the PTT-PSS complex was then metered in, after which the mixture was stirred at 23° C. for a further ½ h.

The weight ratio of monomer:PSS:fluorinated polymer corresponds to 1:2.5:7.5.

The invention claimed is:
1. An electroluminescent arrangement comprising at least two electrodes, of which optionally at least one is applied to an optionally transparent substrate, at least one emitter layer between the two electrodes and at least one hole-injecting layer between one of the two electrodes and the emitter layer, wherein the hole-injecting layer comprises a formulation comprising
A) at least one polythiophene containing recurring units of the formula (I-aa-2)

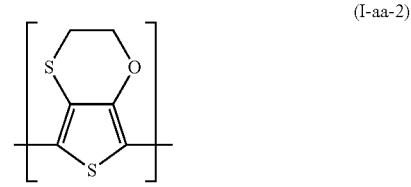

(I-aa-2)

B) at least one polymer containing $SO_3^-M^+$ or $COO^-M^+$ groups, wherein M⁺ represents H⁺, Li⁺, Na⁺, K⁺, Rb⁺, Cs⁺ or $NH_4^+$ and
C) at least one partly fluorinated or perfluorinated polymer containing $SO_3^-M^+$ or $COO^-M^+$ groups, wherein M⁺ represents H⁺, Li⁺, Na⁺, K⁺, Rb⁺, Cs⁺ or $NH_4^+$.

2. The electroluminescent arrangement according to claim 1, wherein M+ in said at least one polymer containing SO3–M+ or COO–M+ groups and in said at least one partly fluorinated or perfluorinated polymer containing SO3–M+ or COO–M+ groups is identical or different and is H+, Na+ or K+.

3. The electroluminescent arrangement according to claim 1, wherein the formulation comprises polystryenesulfonic acid (PSS) as at least one polymer B) containing SO3–M+ or COO–M+ groups.

4. The electroluminescent arrangement according to claim 1, wherein the formulation comprises a copolymer of tetrafluorethylene and the trifluorovinyl ether of poly(hexafluororpropylene oxide)mono(tetrafluoro-vinylsulfonic acid) ether as at least one partially fluorinated or perfluorinated polymer containing $SO_3^-M^+$ or $COO^-M^+$ group.

5. The electroluminescent arrangement according to claim 1, wherein said at least one partly fluorinated or perfluorinated polymer C) containing $SO_3^-M^+$ or $COO^-M^+$ groups, is one containing recurring units of the formulae (II-a) and (II-b)

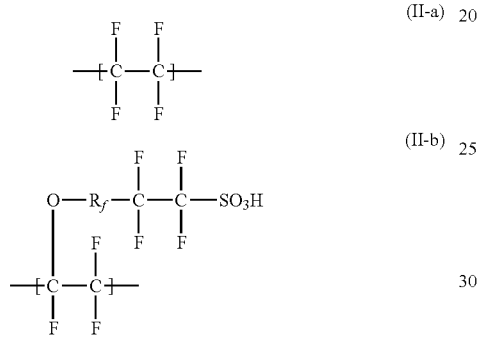

wherein $R_f$ represents a radical having at least one recurring unit(s) of the formula (II-c)

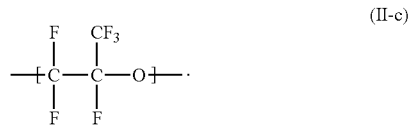

6. The electroluminescent arrangement according to claim 4, wherein $R_f$ represents a radical having 1 to 30 recurring unit(s) of the formula (II-c).

7. The electroluminescent arrangement according to claim 1, wherein the weight ratio of polythiophene(s) A) to partly fluorinated or perfluorinated polymer(s) C) containing $SO_3^-M^+$ or $COO^-M^+$ groups is from 1:2 to 1:15.

8. The electroluminescent arrangement according to claim 1, wherein the weight ratio of polythiophene(s) A) to polymer(s) B) containing $SO_3^-M^+$ or $COO^-M^+$ groups is from 1:2 to 1:25.

9. The electroluminescent arrangement according to claim 7, wherein the weight ratio of polythiophene(s) A) to polymer(s) B) containing $SO_3^-M^+$ or $COO^-M^+$ groups is from 1:2 to 1:25.

10. A process to produce an electroluminescent arrangement comprising at least two electrodes, which comprises applying at least one electrode to an optionally transparent substrate, at least one emitter layer between the two electrodes and at least one hole-injecting layer between one of the two electrodes and the emitter layer, wherein the hole-injecting layer comprises a formulation comprising
   a. at least one polythiophene containing recurring units of the formula (I-aa-2)

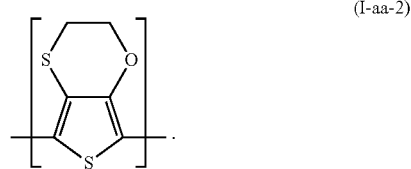

b. at least one polymer containing $SO_3^-M^+$ or $COO^-M^+$ groups, wherein $M^+$ represents $H^+$, $Li^+$, $Na^+$, $K^+$, $Rb^+$, $Cs^+$ or $NH_4^+$ and
   c. at least one partly fluorinated or perfluorinated polymer containing $SOO_3^-M^+$ or $COO^-M^+$ groups, wherein $M^+$ represents $H^+$, $Li^+$, $Na^+$, $K^+$, $Rb^+$, $Cs^+$ or $NH_4^+$
   wherein the composition is obtained by
mixing a finished mixture comprising the at least one polymer B) and the at least one polythiophene A) with the at least one polymer C), the at least one polymer C) optionally being dissolved or dispersed in a diluent D).

11. The electroluminescent arrangement according to claim 1, wherein the composition is obtained by mixing a finished mixture comprising the at least one polymber B) and the at least one polythiophene A) with the at least one polymer C), the at least one polymer C) being in the absence of polymer A) and optionally being dissolved or dispersed in a diluent D).

12. The electroluminescent arrangement according to claim 11, wherein the at least one polymer C) is in the absence of polymer A.

* * * * *